(12) United States Patent
Cruse

(10) Patent No.: US 6,652,710 B2
(45) Date of Patent: *Nov. 25, 2003

(54) PROCESS MONITORING APPARATUS AND METHOD

(75) Inventor: James P. Cruse, Santa Cruz, CA (US)

(73) Assignee: Applied Materials, Inc, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/322,912

(22) Filed: Jun. 1, 1999

(65) Prior Publication Data

US 2001/0051437 A1 Dec. 13, 2001

Related U.S. Application Data

(63) Continuation of application No. 08/854,508, filed on May 12, 1997, now Pat. No. 5,910,011.

(51) Int. Cl.[7] .............................................. H01L 21/66
(52) U.S. Cl. ............................... 156/345.48; 364/468.01
(58) Field of Search ..................... 156/345; 364/468.01, 364/468.28

(56) References Cited

U.S. PATENT DOCUMENTS

| | | | |
|---|---|---|---|
| 4,198,261 A | 4/1980 | Busta et al. ................. 156/626 |
| 4,208,240 A | 6/1980 | Latos ........................... 156/627 |
| 4,842,683 A | 6/1989 | Cheng et al. ................ 156/345 |
| 4,953,982 A | 9/1990 | Ebbing et al. ............... 356/357 |
| 5,200,023 A | * 4/1993 | Gifford et al. ................ 216/59 |
| 5,320,880 A | 6/1994 | Sandhu et al. ............... 427/578 |
| 5,362,356 A | 11/1994 | Schoenborn ................. 156/626 |
| 5,362,969 A | 11/1994 | Glenn .......................... 250/561 |
| 5,406,080 A | 4/1995 | Friedhelm .................... 250/309 |
| 5,444,637 A | 8/1995 | Smesny et al. .............. 364/556 |
| 5,467,013 A | 11/1995 | Williams et al. ............. 324/127 |
| 5,479,340 A | 12/1995 | Fox et al. .................... 364/153 |
| 5,497,331 A | 3/1996 | Iriki et al. .................... 364/468 |
| 5,536,359 A | 7/1996 | Kawada et al. ............ 156/626.1 |
| 5,567,267 A | * 10/1996 | Kazama et al. .............. 156/345 |
| 5,635,409 A | 6/1997 | Moslehi ........................... 438/7 |
| 5,711,843 A | * 1/1998 | Jahns ........................... 156/345 |
| 5,739,051 A | 4/1998 | Saito ............................. 438/16 |
| 5,788,801 A | * 8/1998 | Barbee et al. ............... 156/345 |
| 5,902,403 A | 5/1999 | Aitani et al. |
| 5,955,383 A | * 9/1999 | Hwang ......................... 438/729 |

FOREIGN PATENT DOCUMENTS

EP          0756318          7/1995

OTHER PUBLICATIONS

Heinrich, et al., "Online Uniformity Measurements in Large Area Plasma Assisted Etching and Deposition," presented at the 10th Intern. Colloquium on Plasma Processes CIP '95, Antibes, France, Jun. 11–15, 1995 (four pages).

* cited by examiner

Primary Examiner—Gregory Mills
Assistant Examiner—Sylvia MacArthur
(74) Attorney, Agent, or Firm—Ashok K. Janah; Joseph Bach

(57) ABSTRACT

An apparatus capable of processing a wafer, comprises a chamber adapted to process the wafer, whereby one or more parameters of the process being conducted in the chamber may change during processing of the wafer; and a signal analyzer adapted to receive a plurality of input signals relating to the parameters and provide an output signal in relation to the input signals.

88 Claims, 2 Drawing Sheets

PROCESS MONITORING APPARATUS AND METHOD

CROSS-REFERENCE

Figure 1:
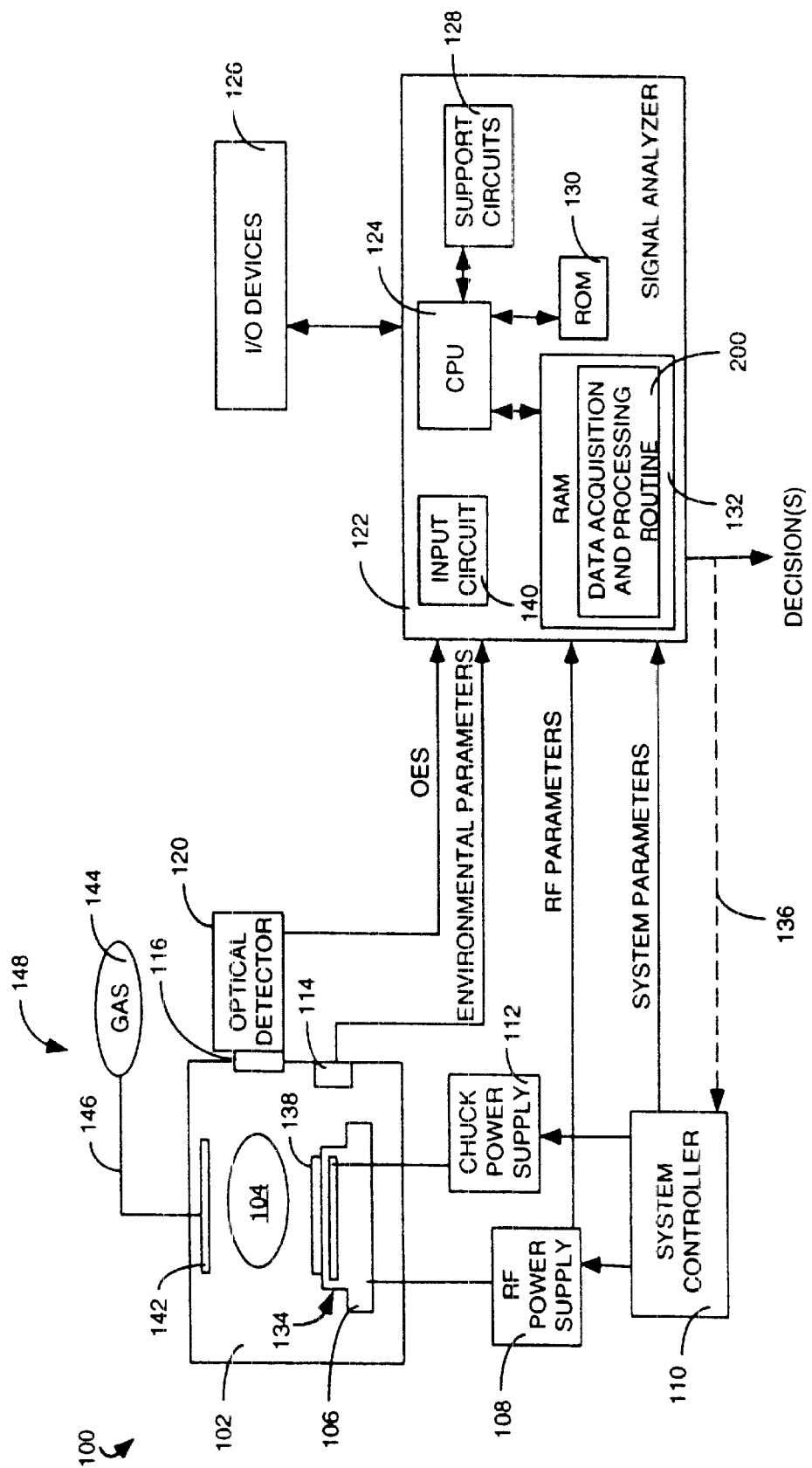

This application is a continuation of U.S. patent application Ser. No. 08/854,508, filed on May 12, 1997, now U.S. Pat. No. 5,910,011 entitled "Method and Apparatus for Monitoring Processes Using Multiple Parameters of a Semiconductor Wafer Processing System," which is incorporated herein by reference.

BACKGROUND

The invention relates to monitoring of process parameters during semiconductor processing.

Plasma enhanced processes that occur within a semiconductor wafer processing system are generally designed to run for a specific length of time and are monitored by methods such as optical emissions spectroscopy (OES). The OES equipment couples to a transparent window of a reaction chamber containing the plasma. The OES equipment monitors the optical emissions from the plasma. Typically, a single wavelength is extracted (filtered) from all of the emissia of the plasma, and the magnitude of the signal at the extracted wavelength indicates the present chemistry within the chamber. A change in this chemistry will increase or decrease the magnitude of the signal at the extracted wavelength and, as such, indicate a change in the process occurring within the chamber.

For example, a plasma in a dry etch process is typically monitored by extracting the carbon monoxide (CO) emission line at 4835 angstroms. A change in the magnitude of the carbon monoxide line is indicative of the endpoint of an oxide etch process.

Extracting a particular line, as well as suppressing the noise generated by the plasma at other wavelengths, requires substantial signal processing and careful OES equipment fabrication and calibration. Such endpoint detection requires the detection of a very small change in signal strength at a particular optical wavelength. As such, the desired signal is easily corrupted by noise. If care is not taken while monitoring the process, the endpoint may not be detected, and the wafer will be overetched. Such overetching may destroy the integrated circuits on the wafer and reduce the yield of the semiconductor wafer processing system.

Therefore, there is a need in the art for improved monitoring techniques for a semiconductor wafer processing system and especially for detecting etch endpoint as well as other process characteristics within a reaction chamber.

SUMMARY

The present invention overcomes the disadvantages associated with the prior art in monitoring semiconductor wafer processes. In one embodiment, the invention comprises an apparatus capable of processing a wafer, the apparatus comprising a chamber adapted to process the wafer, whereby one or more parameters of the process being conducted in the chamber may change during processing of the wafer. A signal analyzer is adapted to receive a plurality of input signals relating to the parameters and provide an output signal in relation to the input signals.

In another version, the apparatus comprises a signal analyzer adapted to receive a plurality of input signals that relate to the parameters, correlate the input signals to one another or to stored values, and provide an output signal.

In another version, the apparatus comprises a chamber adapted to process a wafer, whereby one or more non-optical parameters indicative of a process being conducted in the chamber may change during processing of the wafer; and a signal analyzer adapted to receive one or more input signals relating to the non-optical parameters and provide an output signal in relation to the input signals.

In yet another version, the apparatus comprises one or more sensors that determine parametric data of a process being conducted in the chamber, the parametric data being indicative of characteristics of the process; and a signal analyzer adapted to receive a plurality of input signals from the sensors, the input signals corresponding to the parametric data.

In still another version, the apparatus comprises a plurality of sensors adapted to provide parametric data indicative of characteristics of the processing system; and a signal analyzer adapted to acquire the parametric data.

In another aspect, the present invention comprises a method of processing a wafer in a processing system, the method comprising the step of acquiring parametric data indicative of characteristics of the processing system by a plurality of sensors.

In another version, the method comprises the steps of processing a wafer in a processing system, whereby one or more parameters of the process may change during processing; and receiving a plurality of input signals relating to the parameters and providing an output signal in relation to the input signals.

In another version, the method is useful for monitoring a wafer processing system having multiple parameters. The method comprises the steps of receiving a plurality of input signals that relate to the parameters; correlating the input signals to one another or to other values; and determining an output signal in relation to the correlated input signals.

In another version, the method comprises the steps of processing a wafer, whereby one or more non-optical parameters indicative of the process may change during processing; receiving one or more input signals relating to the non-optical parameters; and providing an output signal in relation to the input signals.

Specifically, the present invention analyzes multiple process parameters and statistically correlates the parameters to detect a change in process characteristics such that the endpoint of an etch process may be accurately detected, as well as detecting other process characteristics within a chamber. The multiple parameters may include plasma optical emissia, environmental parameters such as pressure and temperature within the reaction chamber, RF power parameters such as reflected power or RF match tuning voltage, and system parameters such as particular system configurations and control voltages.

More specifically, the invention contains a statistical engine which correlates all of the relevant parameters for a particular system configuration, and when a particular number of parameters indicate a specific change in characteristics within the reaction chamber, the statistical engine produces a decision which may indicate completion of a particular wafer process. For example, the decision may indicate that the etch endpoint has been attained, may indicate that the chamber requires cleaning, or may indicate some other task needs attention. These decisions may be coupled to a system controller such that feedback is provided to the system controller to facilitate integrated control of the entire semiconductor wafer processing system.

The statistical engine is an executable software program generally executed on a general purpose computer system. However, the statistical engine could be a subroutine that is executed within the microprocessor of the system controller.

The statistical engine forms part of a data acquisition and processing routine that acquires data from various sensors within the semiconductor processing system, correlates that data across the various measured parameters, and periodically stores the correlated data. A previous wafer's correlated data is compared to the present wafer's correlated data to determine a correlation trend from wafer-to-wafer. If the correlation trend exceeds a particular threshold, a wafer-to-wafer flag is set. Depending upon the parameters that are correlated to produce the trend, such an indication may lead to the requirement that the chamber be cleaned. The correlation data for the presently-processed wafer is also compared to a decision threshold to determine whether or not, for example, the etch endpoint has been attained for the present wafer. If the endpoint has not been attained, the query is answered negatively, and the routine continues to acquire data and correlate the data on a periodic basis throughout the processing of the present wafer. At a point where the decision is made that the endpoint has been reached, the process is stopped, and then the routine queries whether another wafer should be processed. If the wafer-to-wafer flag has been set, another wafer will not be processed, and the routine will enter a new processing phase, e.g., cleaning the chamber. If a new wafer is required, the routine will move to acquire data with respect to the next wafer.

By correlating multiple parameters, the signal to noise ratio (SNR) of the correlated signal is substantially improved over the SNR of any single parameter. As such, smaller process changes can be detected and action, in response to those changes, can be rapidly taken. Moreover, correlation trend monitoring not only provides wafer processing characterization but system characterization as well.

DRAWINGS

Figure 2:
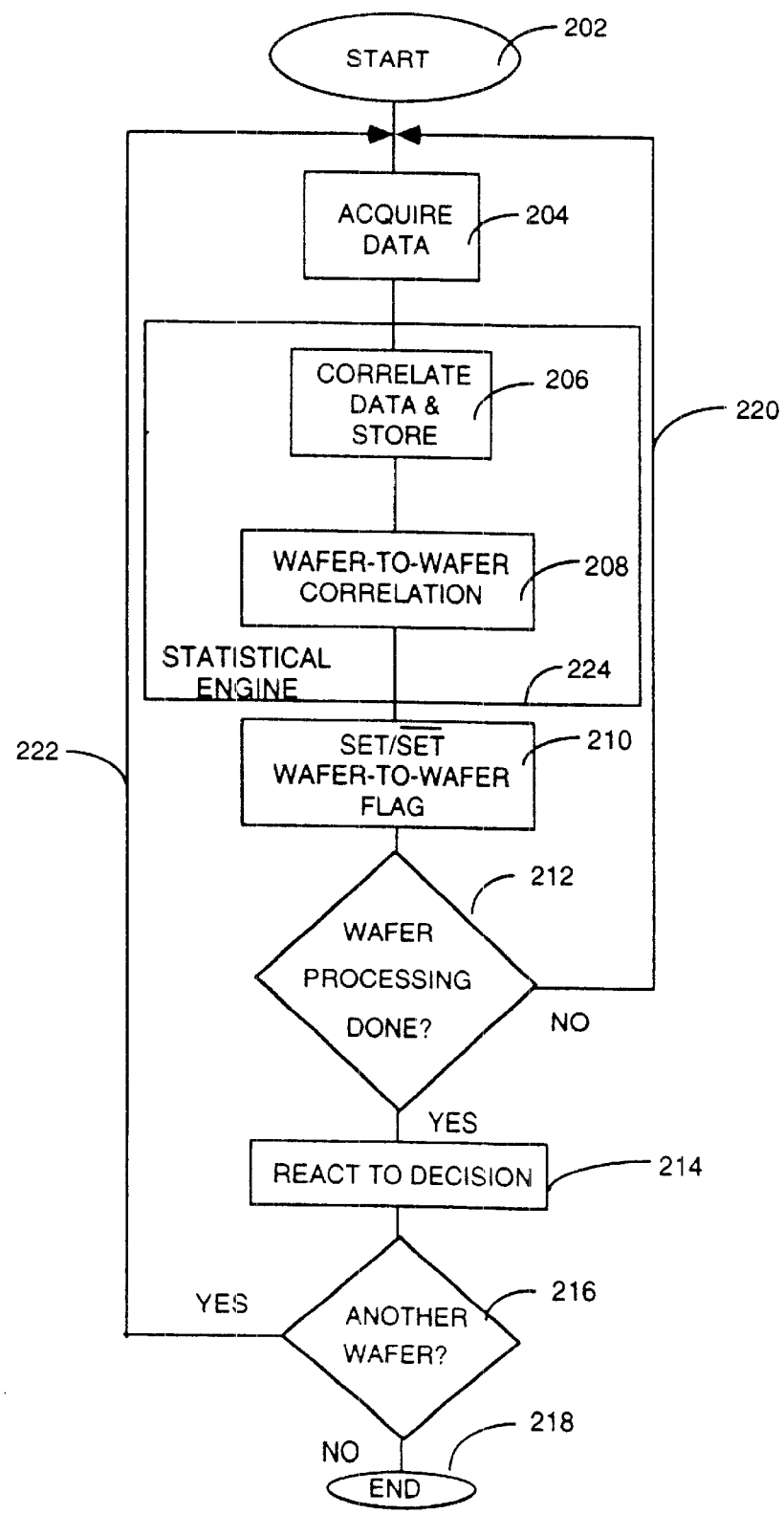

The teachings of the present invention can be readily understood by considering the following detailed description in conjunction with the accompanying drawings, in which:

FIG. 1 depicts a block diagram of a semiconductor wafer processing system containing a multiple parameter signal analyzer in accordance with the present invention; and FIG. 2 depicts a flow diagram of a data acquisition and processing routine.

To facilitate understanding, identical reference numerals have been used, where possible, to designate identical elements that are common to the figures.

DESCRIPTION

FIG. 1 depicts a block diagram of a semiconductor wafer processing system 100 coupled to a signal analyzer 122 of the present invention. The semiconductor wafer processing system 100 contains a reaction chamber 102 having a wafer support pedestal or susceptor 106, an RF power supply 108, a chuck power supply 112, a reactive gas supply assembly 148 and a system controller 110. The susceptor 106 supports the wafer 138 in the chamber. The susceptor 106 contains, for example, an electrostatic chuck 134 for biasing the wafer and retaining it upon the support surface of the susceptor. The chuck is powered by the chuck power supply 112. The susceptor also forms a cathode for the plasma generation system. The cathode is coupled to the RF power supply 108. For example, in an etch system, a plasma is generated by coupling the RF power to a reactive gas. The reactive gas assembly contains a gas supply 144 that supplies a reactive gas via conduit 146 and manifold 142 to the chamber 102. To ignite the plasma, RF power is applied to the cathode. The chamber walls are grounded, and the electric field between the chamber walls and the cathode ignites a plasma 104 within the reaction chamber.

The chuck electrode voltage and the RF power levels are controlled by the system controller 110. The plasma performs plasma-enhanced dry etching of the surface of the semiconductor wafer 138. This simplistic drawing of a semiconductor wafer processing system is intended to be illustrative of the major components of the system. For a detailed description of an etch system, the reader should review U.S. Pat. No. 4,842,683 issued Jun. 27, 1989.

Signal analyzer 122 acquires data from a number of sources within the semiconductor wafer processing system. For example, optical emissia of the plasma 104 are passed through a transparent window 116 to the optical detector 120. The optical detector 120, positioned outside the chamber 102 directly in front of the window 116, converts the optical energy that is coupled through the window into a voltage. The voltage is coupled as one parameter (e.g., an optical emission spectroscopy (OES) parameter) to the signal analyzer. The optical detector may be of many types such as a bandpass photon detector or a photomultiplier tube using a monochromator to select a particular optical wavelength for detection.

The RF power supply 108 generates RF parameters. These parameters include reflected power or the tuning voltage used to tune the match unit to the impedance of the plasma. Changes in the reflected power and/or the tuning voltage are indicative of chemistry changes within the chamber.

The system controller 110 provides control signals to the RF power supply 108 and the DC chuck power supply 112. Additionally, it generates system parameter signals which are coupled to an input circuit 140 of the signal analyzer 122. The chamber may also include a number of environmental sensors 114 such as temperature sensors, foreline and chamber pressure sensors, reactive gas analyzing sensors and the like. These sensors generally produce analog voltages that are also coupled to the input circuit 140. The input circuit synchronizes, digitizes and buffers the data, as needed.

The signal analyzer 122 is typically a general purpose computer having a central processing unit (CPU) 124, a plurality of input/output devices 126, support circuits 128 (e.g., power supplies, clock circuits, bus controllers, cache, and the like), read only memory (ROM) 130, and random access memory (RAM) 132. The interrelation and operation of these components of a general purpose computer are well known in the art.

The signal analyzer correlates all or a subset of the parameters that are provided as input to the analyzer. The data acquisition and processing routine 200 is an executable software program which generally resides in RAM 132 as it is executed by the CPU 124. Decisions made in response to processing the parameters are provided as an output of the signal analyzer 122. These decisions may be coupled along path 136 to the system controller for implementation. As such, the system controller may react to these decisions by ending processing, if an endpoint detection is determined, or initiating a cleaning function, if cleaning of the chamber is deemed required. The parameters and correlated data may also be stored in the RAM 132 for historical review of processing trends. As such, new parameters may be determined for future monitoring.

Although the signal analyzer 122 is described herein as being a stand alone general purpose computer that is programmed to perform the data acquisition and processing functions, these functions may be incorporated into the system controller 110 and executed on the microprocessor of the system controller.

By correlating a number of signals of parameters, such as a first parameter and a second parameter that is a different parameter than the first parameter and consequently is not determined from the first parameter, that are monitored by the signal analyzer, the signal-to-noise ratio (SNR) of the correlated parameters is increased over the SNR of any one parameter signal alone. As such, for a number of parameters, the parameters are known to simultaneously change at a particular point during processing of the wafer. All of those changes can be correlated such that the detected signal is much larger than the underlying noise of the system. For example, a pressure change at the endpoint in a photoresist strip process can be correlated with the RF parameters that change due to a decrease in a chamber pressure. Such a pressure decreased causes the match control unit to change the control voltage to insure that the RF power is matched to the new chamber pressure. Further, a signal is provided by the system controller to change the gas flow rate from the gas supply 144. In addition, at the point in a photoresist strip process when the pressure changes, the plasma optical emissia also will change. Thus, these three parameters (eg., chamber pressure, match control voltage and optical emissions) can be correlated to best indicate the endpoint has been reached in a photoresist strip process. Additionally, these correlated signals as well as others can be monitored from wafer-to-wafer such that trends in the correlated signals can be detected. Such trends are indicative of build-up of impurities and deposits within the chamber. When these wafer-to-wafer correlated signals exceed a certain threshold, the chamber can be deactivated and a cleaning process engaged.

To further improve the decision making properties of the signal analyzer, well-known techniques for decision making can be used such as fuzzy logic, neural networks or stochastic processing.

FIG. 2 depicts a signal acquisition and analysis routine 200 that is executed by the signal analyzer (122 of FIG. 1). The routine begins at step 202 and proceeds to step 204 wherein the data representing the various parameters is acquired. Data acquisition occurs by the signal analyzer 122 periodically polling the various parameter sources for input circuit data. Alternately, the data may be provided to the input circuit on an interrupt basis or as a combination of polling and interrupt. Depending upon the characteristic that is being monitored, all or a subset of the parameters may be used in the data correlation and processing steps.

Using a statistical engine 224, all of the parameters selected to provide information for a particular process are correlated with one another and stored in memory at step 206. The statistical engine 224 also performs, at step 208, a wafer-to-wafer correlation, wherein correlated data from previous wafers at this point in the process are compared to the presently acquired correlated data in an effort to statistically determine a trend in the wafer-to-wafer correlated signals. The wafer-to-wafer correlation may also be performed by comparing the presently acquired correlated data to a theoretical model of expected values. The trend is indicative of a chamber that contains impurities and requires cleaning. As such, the wafer-to-wafer correlation signal is compared to a threshold at step 210, and if the correlation signal exceeds the threshold, the routine sets a wafer-to-wafer flag. This flag indicates whether the chamber requires cleaning, or some other process, after the present wafer has completed processing.

The threshold values and correlated signals are preferably expressed as a ratio of monitored parameters. For example, the signal analyzer 122 receives signals representative of source tuning (ST), load (SL) and current (SI) levels and bias tuning (BT), load (BL) and current (BI) levels. Calculation of the expression $C=(ST \times BT \times SI)/(SL \times BL \times BI)$ results in a value for determining if chamber cleaning is required. Specifically, if $1<C<2$, then the chamber is functioning within its normal operating range. If $C<1$, this condition indicates a hardware failure in the system. If $C>2$, then the chamber has exceeded sanitary limits and must be cleaned. Alternately, the ratio of carbon to fluorine can be monitored against a theoretical value programmed into the signal analyzer. If the observed ratio departs from the theoretical value, this also indicates that the chamber must be cleaned.

At step 212, the correlated data for the presently processed wafer is compared to a threshold, and the routine decides whether to continue processing or to cease processing for this particular wafer. For example, if an etch endpoint is to be detected and the correlated signal does not exceed the threshold indicating the endpoint has been attained, the routine will proceed along the NO path 220 to continue the etch process and acquire data at the next data acquisition period using step 204. This loop is repeated until a decision is made that the endpoint has been attained, and at that point, the query block of step 212 will proceed along the YES path to step 214.

At step 214, the signal analyzer will cause the system to react to the decision. Such a reaction may be as simple as illuminating an indicator lamp indicating that the endpoint has been attained, or it may require a signal to be sent to the system controller to automatically deactivate processing. At step 216, the routine queries whether another wafer will be processed. If the query at step 216 is affirmatively answered, the routine proceeds along path 222 to acquire more data with respect to the next wafer. If another wafer is not to be processed, i.e., the wafer-to-wafer flag is set indicating that the chamber is due for a cleaning process, the routine exits at step 218.

In sum, a semiconductor wafer processing chamber is monitored by a signal analyzer that accepts environmental and system parametric data during wafer processing to detect changes in wafer processing characteristics. Depending on this data, the signal analyzer determines optimal wafer processing conditions and reacts accordingly. Specifically, a statistical engine correlates two or more of the parameters to determine completion of a particular process. The correlation of two or more signals reduces the overall signal-to-noise ratio thereby improving detection of a desired process condition (i.e., wafer processing endpoint). Additionally, the correlated data can be compared to previous data or a baseline theoretical model to determine trends that occur during processing. The trends are indicative of chamber characteristics that require correction or evaluation for improved wafer processing (i.e., chamber cleaning required or additional parameters monitorable for increased accuracy in endpoint detection). As such, a more precisely manufactured product (i.e., a semiconductor wafer) is produced under improved manufacturing conditions.

Although various embodiments which incorporate the teachings of the present invention have been shown and described in detail herein, those skilled in the art can readily devise many other varied embodiments that still incorporate these teachings which are also incorporated in the scope of the present invention.

What is claimed is:

1. An apparatus capable of processing a wafer in a plasma, the apparatus comprising:
   (a) a chamber to process the wafer in the plasma, whereby one or more parameters of a process being conducted in the chamber may change during processing of the wafer in the plasma; and
   (b) a signal analyzer to receive a first input signal of a magnitude of a first parameter detected during processing of the wafer and a second input signal of a magnitude of a second parameter detected during processing of the wafer, the second parameter being a different parameter than the first parameter, and determine an output signal in relation to the first and second input signals during processing of the wafer in the plasma, the output signal being determinative of completion of the process.

2. An apparatus according to claim 1 wherein the signal analyzer provides an output signal determined from a mathematical calculation using the input signals, or by correlating the input signals to one another or to other values.

3. An apparatus according to claim 1 wherein the signal analyzer provides an output signal determined from a non-linear mathematical calculation performed on the input signals.

4. An apparatus according to claim 1 wherein the signal analyzer receives an input signal relating to a non-optical parameter and determines an output signal in relation to the non optical parameter.

5. An apparatus according to claim 1 wherein the signal analyzer receives an input signal comprising one or more of a reflected power data, tuning voltage data, chamber pressure data, foreline pressure data, temperature data, or gas composition data.

6. An apparatus according to claim 1 wherein an input signal to the signal analyzer is provided by one or more of a temperature sensor, a chamber pressure sensor, a foreline pressure sensor, a gas analyzer, an RF power supply, or a system controller.

7. An apparatus according to claim 1 wherein a system controller receives the output signal from the signal analyzer, and controls a process variable of the process chamber in relation to the output signal to end an etching process or to initiate a cleaning process.

8. An apparatus according to claim 1 wherein the signal analyzer comprises a general purpose computer.

9. An apparatus for monitoring a wafer processing system to process a wafer in a plasma and having multiple parameters, the apparatus comprising:
   a signal analyzer to receive a first input signal of a magnitude of a first parameter detected during processing of the wafer in the plasma and a second input signal of a magnitude of a second parameter detected during processing of the wafer, the first and second parameters not being determined from one another and correlate the input signals to one another or to stored values to determine an output signal, the output signal being determinative of completion of processing of the wafer.

10. An apparatus according to claim 9 wherein the signal analyzer correlates the input signals by performing a mathematical calculation on the input signals, relating the input signals to one another, or relating the input signals to the stored values.

11. An apparatus according to claim 9 wherein the signal analyzer provides an output signal determined from a non-linear mathematical calculation performed on the input signals.

12. An apparatus according to claim 9 wherein the signal analyzer receives an input signal relating to a non-optical parameter and determines an output signal in relation to the non-optical parameter.

13. An apparatus according to claim 12 wherein the signal analyzer determines an output signal indicative of a state of processing of the wafer, a condition of the process chamber, or a state of the plasma in the process chamber.

14. An apparatus according to claim 9 wherein an input signal to the signal analyzer is provided by one or more of the following: a temperature sensor, a chamber pressure sensor, a foreline pressure sensor, a gas analyzer, an RF power supply, or a system controller.

15. An apparatus capable of processing a wafer in a plasma, the apparatus comprising:
   (a) a chamber to process the wafer in the plasma, whereby one or more non-optical parameters of a process being conducted in the chamber may change during processing of the wafer in the plasma; and
   (b) a signal analyzer to receive a first input signal of a magnitude of an optical parameter detected during processing of the wafer and a second input signal of a magnitude of a non-optical parameter detected during processing of the wafer, and determine an output signal in relation to the first and second input signals during processing of the wafer in the plasma, the output signal being determinative of completion of the process.

16. An apparatus according to claim 15 wherein the signal analyzer correlates the input signals by performing a mathematical calculation on the input signals, or correlating the input signals to one another or other values.

17. An apparatus according to claim 15 wherein the signal analyzer provides an output signal determined from a non-linear mathematical calculation performed on the input signals.

18. An apparatus according to claim 15 wherein the signal analyzer determines an output signal indicative of a state of processing of the wafer, a condition of the process chamber, or a state of the plasma in the process chamber.

19. An apparatus according to claim 15 wherein an input signal to the signal analyzer is provided by one or more of the following: a temperature sensor, a chamber pressure sensor, a foreline pressure sensor, a gas analyzer, an RF power supply, or a system controller.

20. An apparatus for processing a wafer in a plasma in a chamber, the apparatus comprising:
   (a) a chamber to process the wafer in the plasma;
   (b) a first sensor that detects first parametric data of a process being conducted in the chamber and a second sensor that detects second parametric data of a process being conducted in the chamber, and
   (c) a signal analyzer to receive a first input signal of a magnitude of the first parametric data and a second input signal of a magnitude of the second parametric data detected by the first and second sensors during processing of the wafer in the plasma, the second parametric data being different parametric data than the first parametric data, determine an output signal by correlating the first input signal and second input signal, and compare the output signal to a threshold value to determine completion of the process.

21. An apparatus according to claim 20 wherein the signal analyzer correlates the input signals by performing a mathematical calculation on the input signals, or correlating the input signals to one another or other values.

22. An apparatus according to claim 20 wherein the signal analyzer provides an output signal determined from a non-linear mathematical calculation performed on the input signals.

23. An apparatus according to claim 20 wherein the signal analyzer determines an output signal indicative of a state of processing of the wafer, a condition of the process chamber, or a state of the plasma in the process chamber.

24. An apparatus according to claim 20 wherein the parametric data of the process being conducted in the chamber comprises one or more of a reflected power data, tuning voltage data, chamber pressure data, foreline pressure data, temperature data, or gas composition date.

25. An apparatus capable of analyzing processing of a wafer in a plasma in a processing system, the apparatus comprising:
(a) a first sensor to detect a magnitude of first parametric data of a process being conducted in the processing system and a second sensor adapted to detect a magnitude of second parametric data of the process, the second parametric data being different parametric data than the first parametric data; and
(b) a signal analyzer to acquire the parametric data during processing of the wafer in the plasma, determine an output signal by correlating the first parametric data and second parametric data, and compare the output signal to a threshold value to determine completion of processing of the wafer.

26. An apparatus according to claim 25 wherein the signal analyzer correlates the parametric data by performing a mathematical calculation on the parametric data, or correlating the parametric data to itself or other values.

27. An apparatus according to claim 25 wherein the signal analyzer provides an output signal determined from a non-linear mathematical calculation performed on the parametric data.

28. An apparatus according to claim 25 wherein the signal analyzer determines an output signal indicative of a state of processing of the wafer, a condition of the process chamber, or a state of the plasma of the processing system.

29. An apparatus according to claim 25 wherein the parametric data comprises one or more of a reflected power data, tuning voltage data, chamber pressure data, foreline pressure data, temperature data, or gas composition data.

30. An apparatus capable of processing a wafer, the apparatus comprising:
(a) a chamber comprising (i) a support pedestal capable of receiving the wafer, (ii) a gas manifold to introduce a process gas into the chamber, and (iii) a RF power supply to apply RF power to the support pedestal to form a plasma from the process gas to process the wafer, and to generate a first input signal of a magnitude of a RF parameter generated during a process being conducted in the chamber;
(b) an optical detector to detect a magnitude of an optical emissia generated by the plasma during the process and generate a second input signal of the magnitude of the detected optical emissia; and
(c) a signal analyzer to receive the first input signal and second input signal and determine an output signal in relation to the first and second input signals during processing of the wafer, the output signal being determinative or completion of the process.

31. An apparatus according to claim 30, wherein the signal analyzer provides an output signal determined from a mathematical calculation using the input signals, or by correlating the input signals to one another or to other values.

32. An apparatus according to claim 30, wherein the signal analyzer is adapted to determine an output signal determinative of an endpoint of an etching process.

33. An apparatus according to claim 30, wherein the signal an analyzer is adapted to determine an output signal determinative of completion of processing of a plurality of wafers.

34. An apparatus according to claim 33, wherein the signal analyzer is adapted to determine when cleaning of the chamber is required.

35. An apparatus according to claim 30 wherein the RF power supply is adapted to generate a first input signal in relation to a reflected power generated during the process.

36. An apparatus according to claim 30 wherein the RF power supply is adapted to generate a first input signal in relation to a tuning voltage generated during the process.

37. An apparatus according to claim 30 further comprising a pressure sensor adapted to detect a pressure in the chamber or in a foreline of the chamber and generate a third input signal in relation to the detected pressure, and wherein the signal analyzer is further adapted to receive the third input signal and determine the output signal in relation to the first input signal, second input signal and third input signal.

38. An apparatus according to claim 30 further comprising a temperature sensor adapted to detect a temperature in the chamber and generate a third input signal in relation to the detected temperature, and wherein the signal analyzer is further adapted to receive the third input signal and determine the output signal in relation to the first input signal, second input signal and third input signal.

39. An apparatus according to claim 36 further comprising a gas sensor adapted to detect a gas in the chamber or in a foreline of the chamber and generate a third input signal in relation to the detected gas, and wherein the signal analyzer is further adapted to receive the third input signal and determine the output signal in relation to the first input signal, second input signal and third input signal.

40. An apparatus capable of processing a wafer, the apparatus comprising:
(a) a chamber comprising (i) a support pedestal capable of receiving the wafer, (ii) a gas manifold to introduce a process gas into the chamber, and (iii) a RF power supply to apply RF power to the support pedestal to form a plasma from the process gas to process the wafer;
(b) an optical detector to detect a magnitude of an optical emissia generated by the plasma during a process and generate a first input signal of the magnitude of the detected optical emissia;
(c) a pressure sensor to detect a magnitude of a pressure in the chamber or in a foreline of the chamber during the process and generate a second input signal of the magnitude of the detected pressure; and
(d) a signal analyzer to receive the first input signal and second input signal and determine an output signal in relation to the first and second input signals during processing of the wafer, the output signal being determinative of completion of the process.

41. An apparatus according to claim 40 wherein the signal analyzer provides an output signal determined from a mathematical calculation using the input signals, or by correlating the input signals to one another or to other values.

42. An apparatus according to claim 40 wherein the signal analyzer is adapted to determine an output signal determinative of an endpoint of an etching process.

43. An apparatus according to claim 40 wherein the signal analyzer is adapted to determine an output signal determinative of completion of processing at a plurality of wafers.

44. An apparatus according to claim 43 wherein the signal analyzer is adapted to determine when cleaning of the chamber is required.

45. An apparatus according to claim 40 wherein the RF power supply is adapted to generate a third input signal in relation to a RF parameter generated during the process, and wherein the signal analyzer is further adapted to receive the third input signal and determine the output signal in relation to the first input signal, second input signal and third input signal.

46. An apparatus according to claim 45 wherein the RF power supply is adapted to generate a third input signal in relation to a reflected power generated during the process.

47. An apparatus according to claim 45 wherein the RF power supply is adapted to generate a third input signal in relation to a tuning voltage generated during the process.

48. An apparatus according to claim 40 further comprising a temperature sensor adapted to detect a temperature in the chamber and generate a third input signal in relation to the detected temperature, and wherein the signal analyzer is further adapted to receive the third input signal and determine the output signal in relation to the first input signal, second input signal and third input signal.

49. An apparatus according to claim 40 further comprising a gas sensor adapted to detect a gas in the chamber or foreline and generate a third input signal in relation to the detected gas, and wherein the signal analyzer is further adapted to receive the third input signal and determine the output signal in relation to the first input signal, second input signal and third input signal.

50. An apparatus capable of processing a wafer, the apparatus comprising:
(a) a chamber comprising (i) a support pedestal capable of receiving the wafer, (ii) a gas manifold to introduce a process gas into the chamber, and (iii) a RF power supply to apply a RF power to the support pedestal to form a plasma from the process gas to process the wafer;
(b) an optical detector to detect a magnitude of an optical emissia generated by the plasma during a process and generate a first input signal of the magnitude of the detected optical emissia:
(c) a temperature sensor to detect a magnitude of a temperature in the chamber during the process and generate a second input signal of the magnitude of the detected temperature; and
(d) a signal analyzer to receive the first input signal and second input signal and determine an output signal in relation to the first and second input signals during processing of the wafer, the output signal being determinative of completion of the process.

51. An apparatus according to claim 50 wherein the signal analyzer provides an output signal determined from a mathematical calculation using the input signals, or by correlating the input signals to one another or to other values.

52. An apparatus according to claim 50 wherein the signal analyzer is adapted to determine an output signal determinative of an endpoint of an etching process.

53. An apparatus according to claim 50 wherein the signal analyzer is adapted to determine an output signal determinative of completion of processing of a plurality of wafers.

54. An apparatus according to claim 53 wherein the signal analyzer is adapted to determine when cleaning of the chamber is required.

55. An apparatus according to claim 50 wherein the RF power supply is adapted to generate a third input signal in relation to a RF parameter generated during the process, and wherein the signal analyzer is further adapted to receive the third input signal and determine the output signal in relation to the first input signal, second input signal and third input signal.

56. An apparatus according to claim 55 wherein the RF power supply is adapted to generate a third input signal in relation to a reflected power generated during the process.

57. An apparatus according to claim 55 wherein the RF power supply is adapted to generate a third input signal in relation to a tuning voltage generated during the process.

58. An apparatus according to claim 50 further comprising a pressure sensor adapted to detect a pressure in the chamber or in a foreline of the chamber and generate a third input signal in relation to the detected pressure, and wherein the signal analyzer is further adapted to receive the third input signal and determine the output signal in relation to the first input signal, second input signal and third input signal.

59. An apparatus according to claim 50 further comprising a gas sensor adapted to detect a gas in the chamber or in a foreline of the chamber and generate a third input signal in relation to the detected gas, and wherein the signal analyzer is further adapted to receive the third input signal and determine the output signal in relation to the first input signal, second input signal and third input signal.

60. An apparatus capable of processing a wafer, the apparatus comprising:
(a) a chamber comprising (i) a support pedestal capable of receiving the wafer, (ii) a gas manifold to introduce a gas into the chamber, and (iii) a RF power supply to apply a RF power to the support pedestal to form a plasma from the gas to process the wafer;
(b) an optical detector to detect a magnitude of an optical emissia generated by the plasma during a process and generate a first input signal of the magnitude of the detected optical emissia;
(c) a gas sensor to detect a magnitude of the gas in the chamber or in a foreline of the chamber during the process and generate a second input signal of the magnitude of the detected gas; and
(d) a signal analyzer to receive the first input signal and second input signal and determine an output signal in relation to the first and second input signals during processing of the wafer, the output signal being determinative of completion of the process.

61. An apparatus according to claim 60 wherein the signal analyzer provides an output signal determined from a mathematical calculation using the input signals, or by correlating the input signals to one another or to other values.

62. An apparatus according to claim 60 wherein the signal analyzer is adapted to determine an output signal determinative of an endpoint of an etching process.

63. An apparatus according to claim 60 wherein the signal analyzer is adapted to determine an output signal determinative of completion of processing of a plurality of wafers.

64. An apparatus according to claim 63 wherein the signal analyzer is adapted to determine when cleaning of the chamber is required.

65. An apparatus according to claim 60 wherein the RF power supply is adapted to generate a third input signal in relation to a RF parameter generated during the process, and wherein the signal analyzer is further adapted to receive the third input signal and determine the output signal in relation to the first input signal, second input signal and third input signal.

66. An apparatus according to claim 65 wherein the RF power supply is adapted to generate a third input signal in relation to a reflected power generated during the process.

67. An apparatus according to claim 65 wherein the RF power supply is adapted to generate a third input signal in relation to a tuning voltage generated during the process.

68. An apparatus according to claim 60 further comprising a pressure sensor adapted to detect a pressure in the chamber or the foreline and generate a third input signal in relation to the detected pressure, and wherein the signal analyzer is further adapted to receive the third input signal and determine the output signal in relation to the first input signal, second input signal and third input signal.

69. An apparatus according to claim 65 further comprising a temperature sensor adapted to detect a temperature in the chamber and generate a third input signal in relation to the detected temperature, and wherein the signal analyzer is further adapted to receive the third input signal and determine the output signal in relation to the first input signal, second input signal and third input signal.

70. An apparatus capable of processing a wafer, the apparatus comprising:
(a) a chamber comprising (i) a support pedestal capable of receiving the wafer, (ii) a gas manifold to introduce a process gas into the chamber, and (iii) a RF power supply to apply RF power to the support pedestal to form a plasma from the process gas to process the wafer and generate a first input signal of a magnitude of a RF parameter generated during a process being conducted in the chamber;
(b) a pressure sensor to detect a magnitude of a pressure in the chamber during the process and generate a second input signal of the magnitude of the detected pressure; and
(c) a signal analyzer to receive the first input signal and second input signal and determine an output signal in relation to the first and second input signals during processing of the wafer, the output signal being determinative of completion of the process.

71. An apparatus according to claim 70 wherein the signal analyzer provides an output signal determined from a mathematical calculation using the input signals, or by correlating the input signals to one another or to other values.

72. An apparatus according to claim 70 wherein the signal analyzer is adapted to determine an output signal determinative of an endpoint of an etching process.

73. An apparatus according to claim 70 wherein the signal analyzer is adapted to determine an output signal determinative of completion of processing of a plurality of wafers.

74. An apparatus according to claim 73 wherein the signal analyzer is adapted to determine when cleaning of the chamber is required.

75. An apparatus according to claim 70 wherein the RF power supply is adapted to generate a first input signal in relation to a reflected power generated during the process.

76. An apparatus according to claim 70 wherein the RF power supply is adapted to generate a first input signal in relation to a tuning voltage generated during the process.

77. An apparatus according to claim 70 further comprising an optical detector adapted to detect optical emissia generated by the plasma in the chamber during the process and generate a third input signal in relation to the detected optical emissia, and wherein the signal analyzer is further adapted to receive the third input signal and determine the output signal in relation to the first input signal, second input signal and third input signal.

78. An apparatus according to claim 70 further comprising a pressure sensor adapted to detect a pressure in the chamber or in a foreline of the chamber during the process and generate a third input signal in relation to the detected pressure, and wherein the signal analyzer is further adapted to receive the third input signal and determine the output signal in relation to the first input signal, second input signal and third input signal.

79. An apparatus according to claim 70 further comprising a temperature sensor adapted to detect a temperature in the chamber during the process and generate a third input signal in relation to the detected temperature, and wherein the signal analyzer is further adapted to receive the third input signal and determine the output signal in relation to the first input signal, second input signal and third input signal.

80. An apparatus according to claim 70 further comprising a gas sensor adapted to detect a gas in the chamber or in a foreline of the chamber during the process and generate a third input signal in relation to the detected gas, and wherein the signal analyzer is further adapted to receive the third input signal and determine the output signal in relation to the first input signal, second input signal and third input signal.

81. An apparatus capable of processing a wafer, the apparatus comprising:
(a) a chamber comprising (i) a support pedestal capable of receiving the wafer, (ii) a gas manifold to introduce a process gas into the chamber, and (iii) a RF power supply to apply RF power to the support pedestal to form a plasma from the process gas to process the wafer, whereby one or more non optical parameters of a process being conducted in the chamber may change during processing of the wafer; and
(b) a signal analyzer to receive a first input signal of a magnitude of a first non-optical parameter detected during the process and a second input signal of a magnitude of a second non-optical parameter detected during the process, the second non-optical parameter being a different parameter than the first non-optical parameter, and determine an output signal in relation to the first and second input signals during processing of the wafer, the output signal being determinative of completion of the process.

82. An apparatus according to claim 81 wherein the signal analyzer correlates the input signals by performing a mathematical calculation on the input signals, or correlating the input signals to one another or other values.

83. An apparatus according to claim 82 wherein the signal analyzer provides an output signal determined from a non-linear mathematical calculation performed on the input signals.

84. An apparatus according to claim 81 wherein the signal analyzer is adapted to determine an output signal determinative of an endpoint of an etching process.

85. An apparatus according to claim 81 wherein the signal analyzer is adapted to determine an output signal determinative of completion of processing of a plurality of wafers.

86. An apparatus according to claim 85 wherein the signal analyzer is adapted to determine when cleaning of the chamber is required.

87. An apparatus according to claim 81 wherein the signal analyzer determines an output signal indicative of a state of processing of the wafer, a condition of the process chamber, or a state of a plasma in the process chamber.

88. An apparatus according to claim 81 wherein one or more of the non-optical parameters comprise a temperature, a chamber pressure, a foreline pressure, a presence of a reactive gas, an RF parameter, or a system controller parameter.

\* \* \* \* \*